(12) United States Patent
Kurd et al.

(10) Patent No.: US 6,477,657 B1
(45) Date of Patent: Nov. 5, 2002

(54) CIRCUIT FOR I/O CLOCK GENERATION

(75) Inventors: Nasser A. Kurd, Hillsboro; R. Tim Frodsham, Portland; E. Jeffrey Wight, Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/302,168

(22) Filed: Apr. 29, 1999

(51) Int. Cl.[7] .................................................. G06F 1/04
(52) U.S. Cl. ........................................ 713/501; 713/400
(58) Field of Search ................................. 713/400, 500, 713/501, 600

(56) References Cited

U.S. PATENT DOCUMENTS

| | | | |
|---|---|---|---|
| 4,835,728 A | | 5/1989 | Si et al. |
| 4,893,271 A | * | 1/1990 | Davis et al. ................. 713/501 |
| 5,289,866 A | | 3/1994 | Parsley et al. |
| 5,307,381 A | | 4/1994 | Ahuja |
| 5,339,253 A | | 8/1994 | Carrig et al. |
| 5,361,277 A | | 11/1994 | Grover |
| 5,376,842 A | | 12/1994 | Honoa et al. |
| 5,397,943 A | | 3/1995 | West et al. |
| 5,398,262 A | | 3/1995 | Ahuja |
| 5,471,587 A | * | 11/1995 | Fernando .................... 710/129 |
| 5,630,107 A | * | 5/1997 | Carmean et al. ............. 713/601 |
| 5,634,116 A | * | 5/1997 | Singer ......................... 713/400 |
| 5,640,547 A | * | 6/1997 | Hotta et al. .................. 713/500 |
| 5,862,373 A | * | 1/1999 | Pathikonda et al. ......... 713/501 |
| 5,978,926 A | * | 11/1999 | Ries et al. .................... 713/501 |
| 6,047,382 A | * | 4/2000 | Maley et al. ................. 713/501 |

* cited by examiner

*Primary Examiner*—Dennis M. Butler
(74) *Attorney, Agent, or Firm*—Blakely, Sokoloff, Taylor & Zafman LLP

(57) ABSTRACT

Various apparatuses and methods to generate a clock signal that controls data operations in an integrated circuit. In an embodiment, a circuit for generating a clock signal that controls data operations in an integrated circuit includes a first clock synthesizer, a divider circuit, and a second clock synthesizer. The first clock synthesizer produces a first signal derived from an external reference signal. The first signal has a first frequency that is greater than a frequency of the external reference signal. The divider circuit divides the frequency of the first signal by N, where N is an integer greater than 1. The divider circuit outputs a second signal having a second frequency which is equal to the first frequency divided by N. The second clock synthesizer couples to the divider circuit for producing the clock signal at a frequency which is an integer multiple of the second signal. The second clock synthesizer also produces a strobe signal. The strobe signal has a rising edge that is either centered, or is coincident, with respect to a changing data signal of a processor.

23 Claims, 10 Drawing Sheets

CIRCUIT FOR I/O CLOCK GENERATION

FIELD OF THE INVENTION

The present invention relates generally to the field of microprocessors for use in computer systems; more particularly, to apparatus and methods used to control the timing of data operations in a high-performance processor.

BACKGROUND OF THE INVENTION

Very large integrated circuits often synchronize data operations to a clocking signal that acts as a global timing reference. A great variety of circuit devices operate in this manner. Perhaps most notable of these circuits are microprocessors and other data processing devices which can operate at high frequencies.

In such circuits there is a need to couple the clocking signal to each of the functional blocks distributed about the semiconductor chip. This means that integrated circuits operating synchronously, such as a microprocessor, have a need for a network that distributes the clock signal across the chip. In a typical microprocessor, for example, the clock signal is often generated internal to the chip from an external signal that provides a reference frequency input. The external clock signal is commonly derived from a crystal resonator circuit. The internally generated clock signal is then coupled to the various functional units or logic clusters of the microprocessor. Synchronous logic functions obviously imply the need for some sort of clock distribution network.

The prior art includes numerous examples of different clock generator circuit designs coupled with distribution networks designed to achieve a global clocking signal having a low clock skew across a large chip. For example, U.S. Pat. Nos. 5,289,866; 5,307,381; 5,339,253; 5,361,277; 5,376,842; 5,397,943; and 5,398,262 describe clock distribution networks and clock synchronization circuitry for use in a very large scale integrated circuit such as microprocessor.

Communication of data from one agent into another agent in a computing system is commonly achieved in accordance with a source synchronous protocol. The source synchronous protocol involves sending data along with a clock signal or strobe from a transmitting agent to a receiving agent. The receiving agent then uses the clock signal to synchronously latch or save the received data. Typically, the receiving element derives its latching signal from the incoming strobe. One prior art method is to have the strobe or clock signal related to the data such that if the data it is sent on a rising clock edge, the strobe signal edge transition occurs at the center of the changing data. This is called centered source synchronous strobing.

Because logic operations in a processor are also tied to the processor's global system clock, it is important that input/output (I/O) clock generation be synchronized with the global system clock signal. Commonly, however, the input/output (I/O) devices that rely upon I/O clock signals require that the I/O clock signal be at a frequency less than the frequency of the core system clock. For example, the frequency of bus operations are often fixed to a reference clock signal. The core frequency of the processor is often a much higher rate than the reference clock frequency associated with the bus. By way of example, some advanced processors can operate with a core frequency greater than 500 MHz. Within that range, there is a need to support the fixed data rate transactions that occur on the bus.

One problem that exists is that the global clocking signal (i.e., associated with the core frequency) and the bus clock signal ratio is such that the I/O clock signal cannot be generated directly from the global (core) clocking signal. Moreover, if they are not generated locally, extensive routing of I/O clock signals in a chip takes a valuable space and power and can introduce delays and other inaccuracies in the clock signal.

Thus, there exists a need for a method and apparatus that generates I/O clock signals used for data transfers that is derived from the global system clock, without requiring additional routing of clock signals. Furthermore, the data transfer rate should be consistent regardless of varying or unusual core/bus clock frequency ratios.

SUMMARY OF THE INVENTION

Various apparatuses and methods to generate a clock signal that controls data operations in an integrated circuit. In an embodiment, a circuit for generating a clock signal that controls data operations in an integrated circuit includes a first clock synthesizer, a divider circuit, and a second clock synthesizer. The first clock synthesizer produces a first signal derived from an external reference signal. The first signal has a first frequency that is greater than a frequency of the external reference signal. The divider circuit divides the frequency of the first signal by N, where N is an integer greater than 1. The divider circuit outputs a second signal having a second frequency which is equal to the first frequency divided by N. The second clock synthesizer couples to the divider circuit for producing the clock signal at a frequency which is an integer multiple of the second signal. The second clock synthesizer also produces a strobe signal. The strobe signal has a rising edge that is either centered, or is coincident, with respect to a changing data signal of a processor.

BRIEF DESCRIPTION OF THE DRAWINGS

The present invention is illustrated by way of example, and not limitation, in the figures of the accompanying drawings, where.

DETAILED DESCRIPTION

Throughout the following description, numerous specific details are set forth in order to provide a thorough understanding of the invention. However, it should be understood that the invention could be practiced without these particulars. In other instances, well known elements have not been shown or described in detail to avoid unnecessarily obscuring the present invention. By way of example, the invention is described incorporated in a microprocessor. It should be understood, however, that the invention has application in a wide variety of integrated circuits, e.g., any digital chip that relies upon I/O signaling).

The present invention is directed to a circuit that uses a global clock generator for clocking the core logic of an integrated circuit (IC), and a clock synthesizer such as a delay-locked loop/phase-locked loop for I/O clock signal generation. Often times, these data operations involve transfer of information across a bus that is operated at a frequency which is much slower than the range of frequencies of the core logic of the processor. Logic elements within an integrated circuit that receive data and an external strobe signal use that signal to determine when to latch the data.

Logic operations in a processor are typically tied to the processor's global system clock. Traditionally, the problem has been how to generate data clock and strobe signals out of the high frequency global system clock when the core frequency to bus clock frequency ratio is a non-integer multiple. That is to say, it is difficult to generate the data clock and strobe signals directly from the global clock signal due to unwieldy clock frequency ratios. By way of example, one prior art approach attempts to generate a strobe signal coincident with a divided global clock signal. However, the edge of the strobe clock signal becomes a variable based on the core clock due to variable core frequencies and the non-integer ratio between the core and data clock rates. Routing difficulties can also introduce delays and various other errors in the clocking signal.

Figure 1:
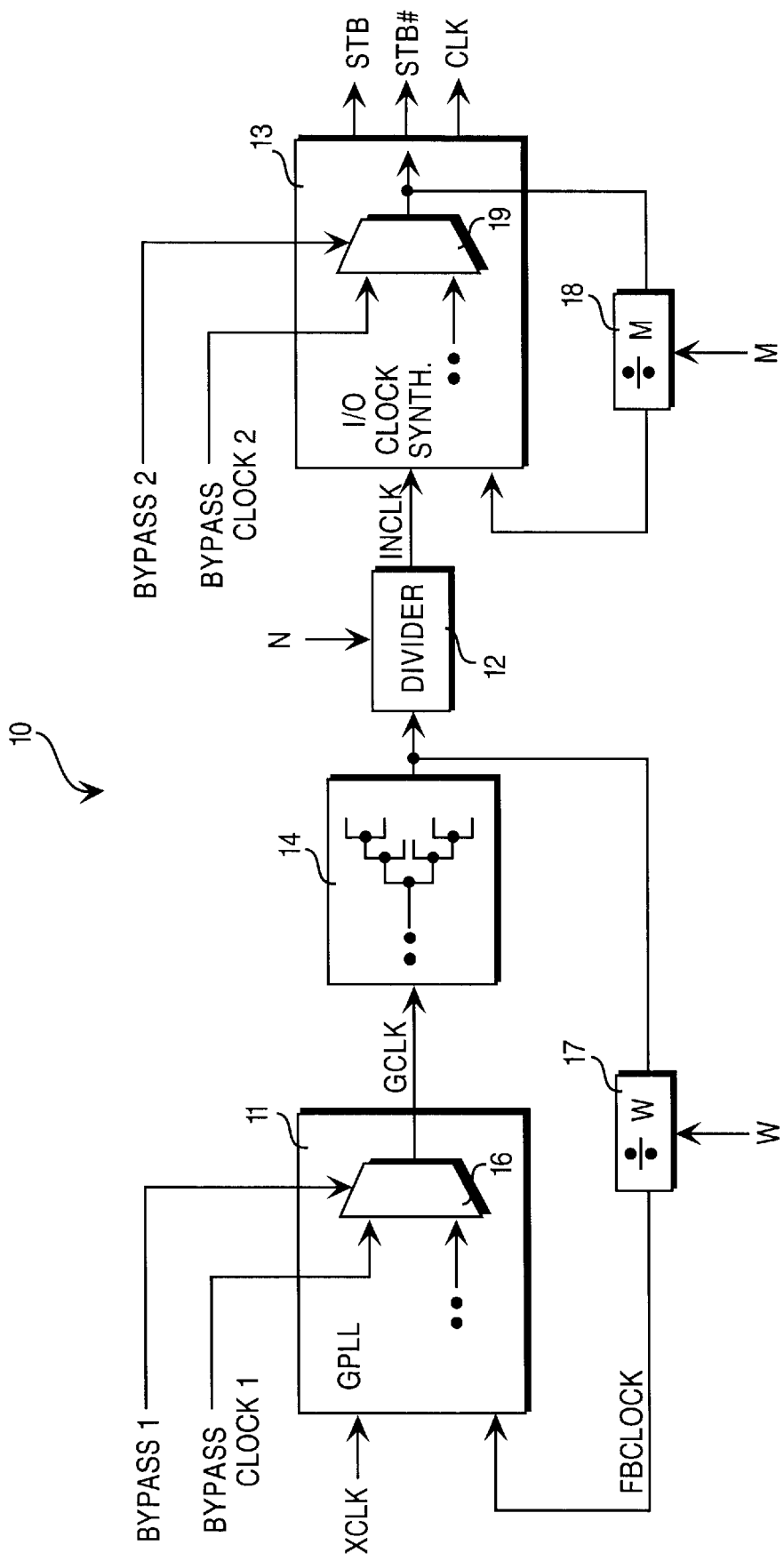
FIG. 1 is a block diagram of the circuit architecture of one embodiment of the present invention.

With reference now to FIG. 1, a circuit 10 useful for generating clock signals that control I/O operations on a bus coupled to a processor is shown. A global phase-locked loop (GPLL) circuit 11 receives an external reference signal (XCLK) and uses that signal to generate a global clock signal (GCLK) coupled throughout the processor (as represented by network 14). In one implementation, the frequency of the XCLK signal is approximately 100 MHz.

Global PLL 11 typically comprises a conventional voltage-controlled oscillator, divider, and phase detector circuitry to produce the GCLK signal at a much higher frequency compared to the frequency of the external reference signal. It should be appreciated, however, that any kind of clock synthesizer could be used. For example, in one embodiment, the frequency of the XCLK signal is 100 MHz and the frequency of the GCLK signal is 900 MHz. As mentioned previously, the global clock signal is distributed to the core logic of the integrated circuit. Multiplication of the external reference signal is achieved utilizing a feedback loop that includes a programmable divider 17, which may be programmed to an integer value W. Divider 17 produces a feedback signal, FBCLOCK, back to the input of GPLL 11.

The GCLK signal output from global PLL 11 is also input to another programmable divider circuit 12 that reduces the frequency of the GCLK signal by a variable factor of N. The divider circuit produces an input clock signal (INCLK) coupled to clock synthesizer circuit 13. Continuing with the example provided above, if the XCLK signal is 100 MHz, a 900 MHz GCLK signal is output from global PLL 11. In this case, by setting N equal to 9, the output of programmable divider 12 (i.e., the INCLK signal) is 100 MHz. This signal frequency relationship is illustrated in the timing diagram of FIG. 3.

With continuing reference to FIG. 1, clock synthesizer circuit 13 can be implemented in a variety of ways, such as a delay-lock loop (DLL) circuit or a phase-lock loop (PLL) circuit. In either case, clock synthesizer 13 generates a data clock signal (CLK) and a strobe signal (STB), along with its complement (STB#). The feedback loop of clock synthesizer 13 is shown including a programmable divider 18 that determines the frequency multiplication factor M.

Practitioners in the art will appreciate that implementing clock synthesizer 13 as a DLL circuit may be beneficial to reduce jitter produced by circuit environmental factors (e.g., noise, temperature, power supply variability, etc.). Conversely, a PLL implementation may be advantageously selected to increase the frequency of the output signals, or to improve the integrity of the clocking signals.

Note that both global PLL circuit 11 and clock synthesizer 13 also have bypass mode inputs, labeled $BYPASS_1$ and $BYPASS_2$, respectively. When global PLL 11 is operated in the $BYPASS_1$ mode (by asserting the $BYPASS_1$ signal line), an external signal (e.g., BYPASS $CLOCK_1$) can be distributed as the global clock signal. In such a situation, circuit 10 still generates the appropriate CLK and STB signals by using, for example, a different value of N as the input to programmable divider 12. Implementation of the bypass feature in GPLL 11 is shown logically by multiplexer 16, in which the $BYPASS_1$ signal functions as the select signal for multiplexer 16.

When the clock synthesizer circuit 13 is operated in $BYPASS_2$ mode of operation, an external clock signal (e.g., BYPASS $CLOCK_2$) is used directly to generate the I/O clock and strobe signals. The bypass feature of clock synthesizer 13 is shown logically by multiplexer 19. The $BYPASS_2$ signal selects either the multiplied INCLK signal or the BYPASS $CLOCK_2$ signal as the output of multiplexer 19. Practitioners familiar with the integrated circuit arts will appreciate that this mode of operation is very useful to facilitate testing or troubleshooting of an integrated circuit. Also beneficial is the ability to bypass the core and I/O clocks independently.

Figure 2:
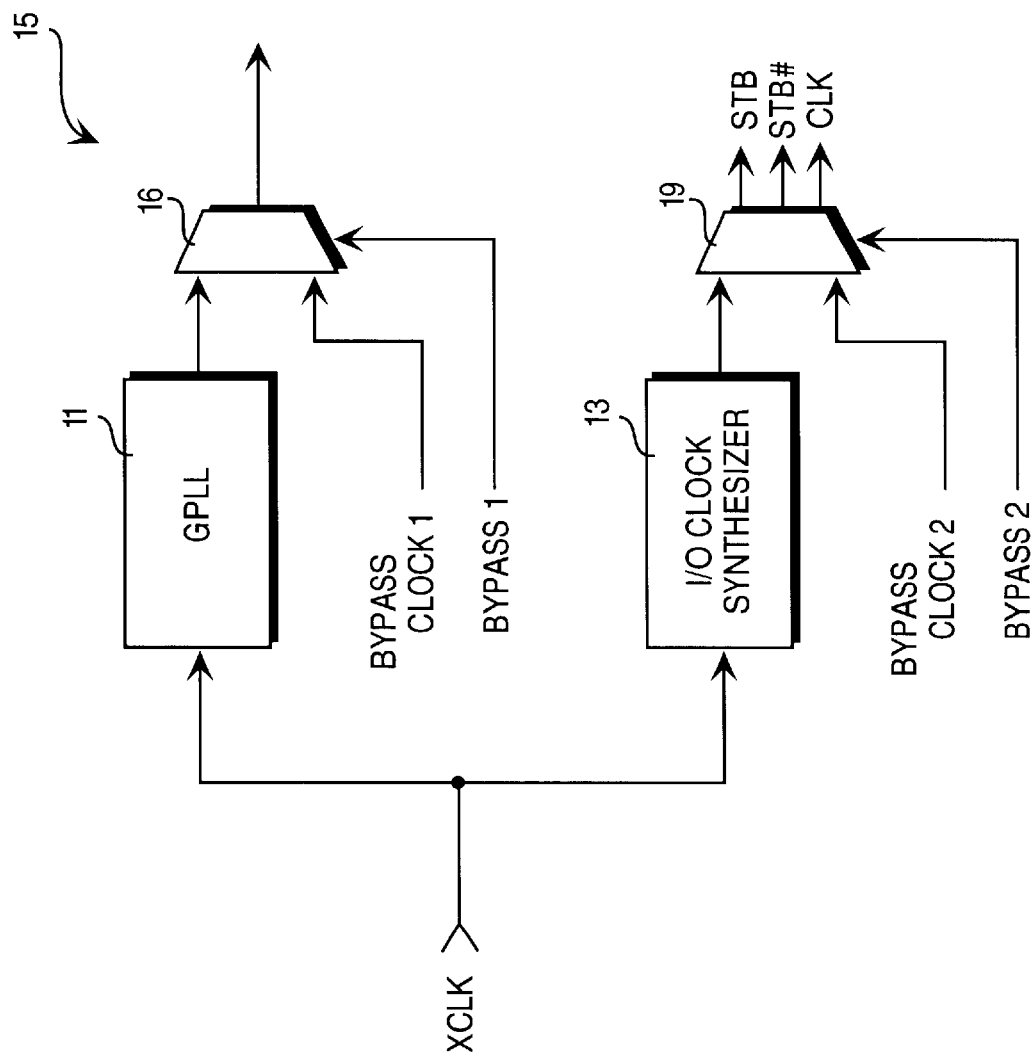
FIG. 2 is a block diagram of the circuit architecture of an alternative embodiment of the present invention.

With reference now to FIG. 2, there is shown a block diagram of a circuit 15 representing an alternative embodiment of the present invention. Whereas the embodiment of FIG. 1 implements a series configuration, the embodiment of FIG. 2 includes a global PLL 11 configured in parallel with a clock synthesizer 13. In other words, both global PLL 11 and clock synthesizer 13 receive an external reference signal (XCLK) as an input. Global PLL 11 generates the global clocking signal (GCLK) coupled to the core logic of the processor derived from the XCLK signal. At the same time, clock synthesizer 13 generates the data clock (CLK) and a strobe clock signal (STB) from the XCLK input signal. The CLK and STB signals are used for data bus transfer of information to and from the processor. On the other hand, the GCLK signal is distributed to the core of the chip.

Another alternative is provide two separate, independent external reference signals: a first one coupled as an input to GPLL 11, and a second one coupled as an input to clock synthesizer 13. In such an implementation, the two external reference signals may either operate at the same frequency, or at different frequencies.

One of the benefits of the embodiment shown in FIG. 2 is that it does not accumulate phase error of series-connected clock synthesizer circuits. It should be understood, however, that circuit 15 may be constrained with respect to the placement of circuit 11 and circuit 13. To avoid skew and other signaling errors, global PLL circuit 11 and clock synthesizer 13 should be located on the chip close to one another.

Note that circuit 15 also includes bypass modes of operation (BYPASS$_1$, BYPASS$_2$) to permit input of a different external clock signal independently to each of clock synthesizers 11 and 13, respectively. As before, the bypass modes of operation are illustrated logically with multiplexers 16 and 19 associated with respective clock synthesizers 11 and 13.

Figure 3:
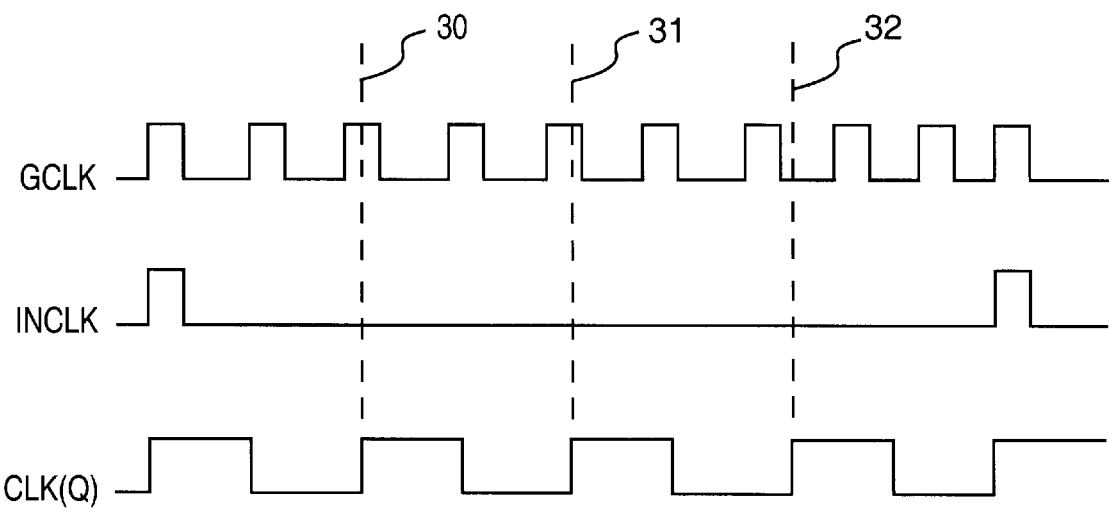
FIG. 3 illustrates the timing relationship of various signals shown in FIG. 1 for a certain mode of operation.

FIG. 3 is a timing diagram showing the relationship of the GCLK, INCLK, and data clock (CLK) signals for one particular implementation of the present invention. In the example of FIG. 3, GCLK has a frequency of 900 mhz, INCLK has a frequency of 100 mhz, and CLK(Q) has a frequency of 400 mhz. The timing diagram of FIG. 3 illustrates, by way of example, the data clock signal CLK(Q) operating in a "quad" mode, wherein clock synthesizer 13 outputs a data clock signal and a strobe signal at four times the rate of the input signal. The CLK(D) signal shown in FIG. 3 has a 50% duty cycle.

Figure 4A:
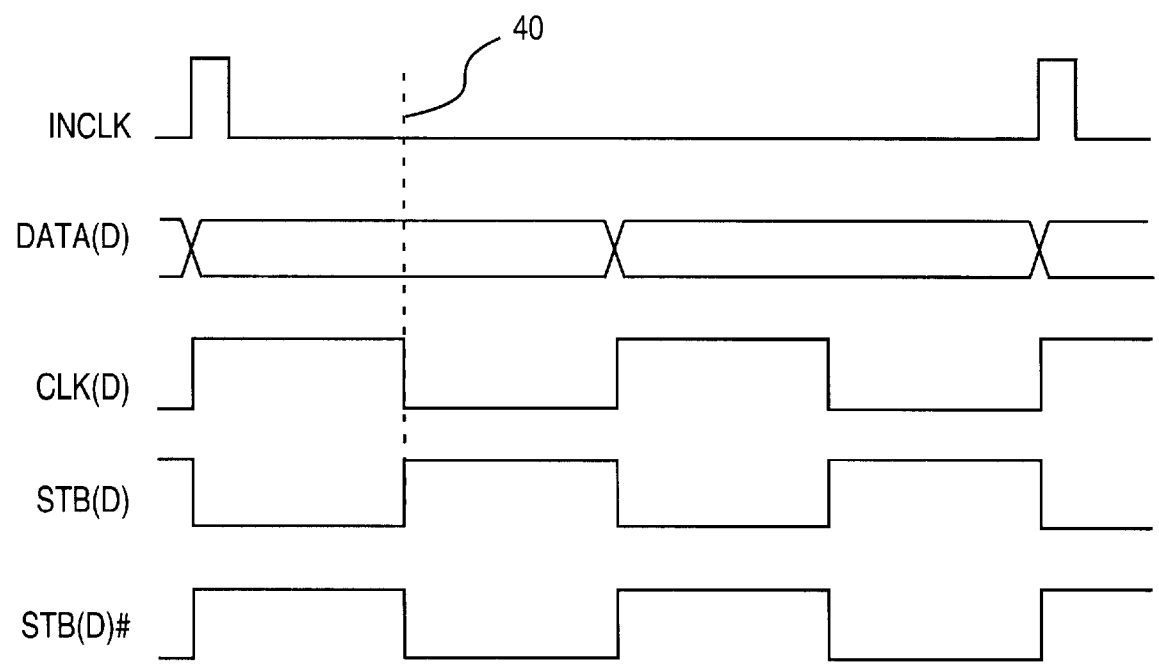
FIGS. 4B & 4B illustrate the timing relationship of various signals shown in FIG. 1 for two different modes of operation.

In the example of FIG. 4A, clock synthesizer 13 generates a clock signal, CLK(D) and a strobe signal, STB(D), at twice the rate of the input signal, i.e., a double mode of operation. (It should be understood that the invention is not limited to operating in only the double or quad modes of operation.) In the example provided above, clock synthesizer 13 outputs data clock and strobe signals at either 200 MHz or 400 MHz, depending on the mode of operation selected.

The flexibility of this programmable design can be seen in FIG. 3, where a 400 MHz CLK(Q) signal is generated for an I/O device, despite the fact that no corresponding rising or falling edges exist in the GCLK signal. This is apparent in FIG. 3 from dashed lines 30, 31 and 32, which correspond to the rising edges of three consecutive CLK(Q) signal edges, respectively. None of these rising edges are coincident with, or correspond to, any edge transitions of the global clock signal. In other words, even though the processor may operate with a variable core frequency, the present invention is able to maintain a fixed data transfer rate that is independent of the core frequency of the processor.

Figure 4B:
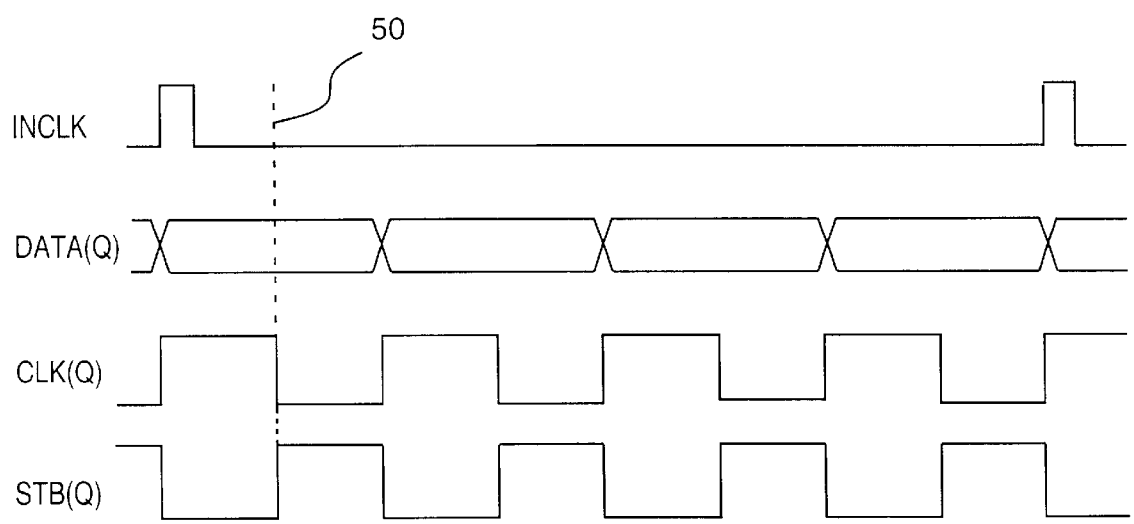

FIG. 4A illustrates the timing relationship between various signals in the circuit of the present invention, wherein the clock synthesizer 13 is in the double mode of operation. Note that in the timing diagram of FIG. 4A, the falling edge of the data clock signal CLK(D) occurs centered with respect to the changing data signal. For example, a first falling edge transition of the data clock signal CLK(D), occurs at dashed line 40 in the center of the data signal DATA(D). Similarly, FIG. 4B illustrates a falling edge transition of the data clock signal occurring in the center of the changing data signal at dashed line 50. In the example of FIG. 4A, showing the double mode of operation, the DATA (D) signal transitions occur upon each rising edge of the CLK(D) clock cycle. As can be seen, the falling edges of CLK(D) and the rising edges of the STB(D) signal are centered with respect to the changing data signal.

Figure 5:
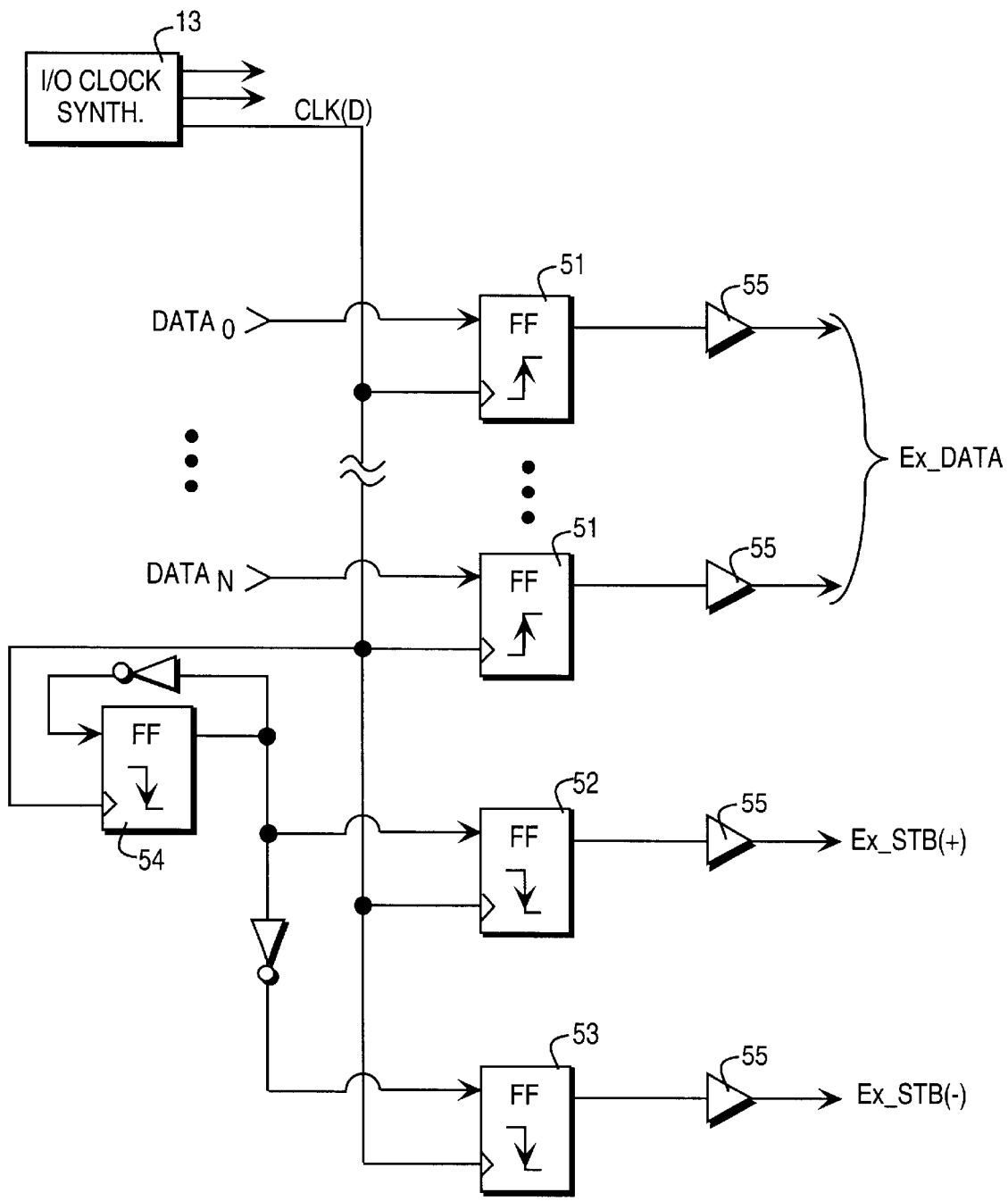
FIG. 5 is a logic diagram of a circuit for producing external data and strobe signals from a synthesized clock signal.

With reference to FIG. 5, there is shown a logic diagram of a circuit for producing external data and strobe signals from a synthesized clock signal. In FIG. 5, the CLK signal produced by clock synthesizer 13 is coupled to the clock inputs of flip-flops 51–54. Flip-flops 51 are triggered on the rising edge transition of CLK, whereas flip-flops 52–54 are triggered on the falling edge transition of CLK. Each of the flip-flops 51 receives one of data bits DATA$_0$–DATA$_N$ to be driven onto the external bus. The outputs of flip-flops 51 are coupled through driver buffers 55 to the external bus. The collective outputs of drivers 55 comprise the external data signals EX_DATA$_{0-N}$ driven onto the external bus.

Flip-flop 54, which is clocked on the falling edge of CLK, acts as a strobe enable device, with its output coupled to the inputs of flip-flops 52 and 53. Flip-flops 52 and 53 respectively generate the external strobe signals EX_STB(+) and EX_STB(-) through driver buffers 55. These external strobe signals are utilized to latch the EX_DATA$_{0-N}$ signals provided on the external bus.

Figure 6:
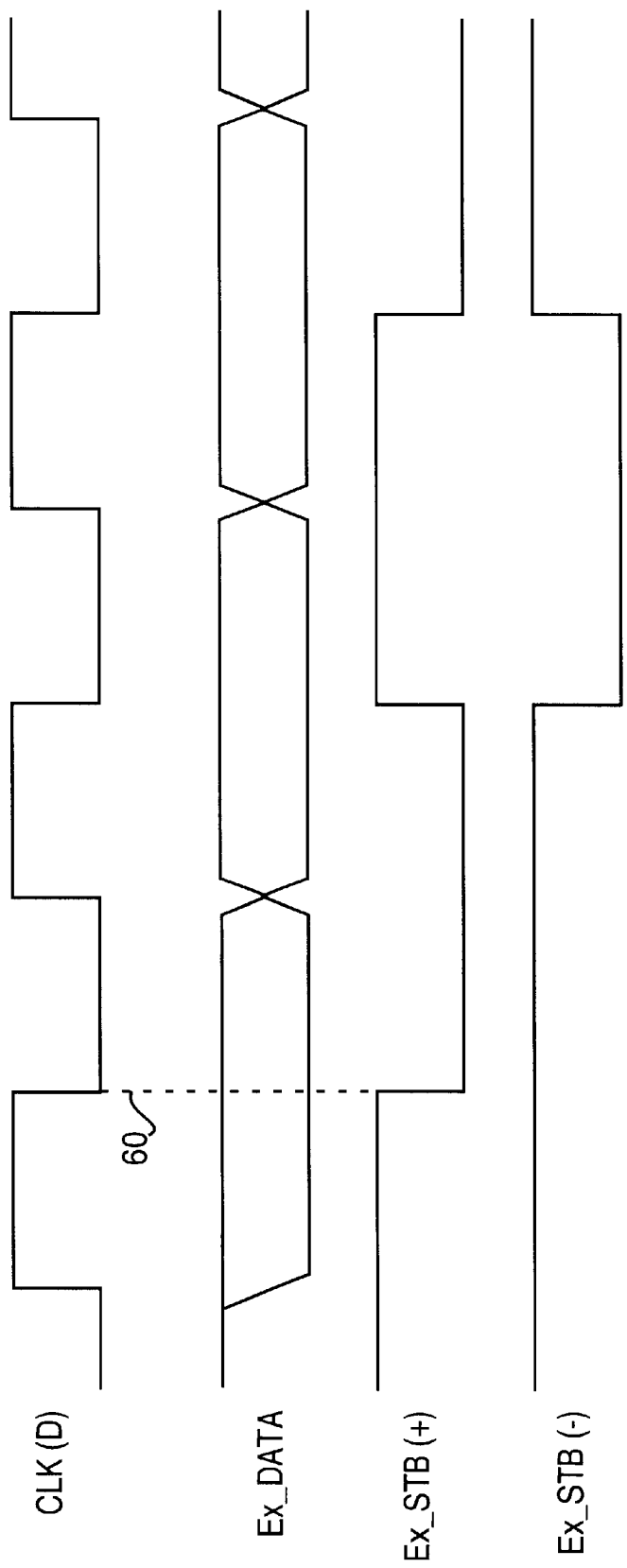
FIG. 6 illustrates the timing relationship of various signals shown in FIG. 5.

FIG. 6 illustrates the timing relationship between the CLK, EX_DATA, and EX_STB signals for the logic diagram of FIG. 5. Note that the timing diagram shows that this implementation achieves centered strobing by using a single data clock signal (CLK), with the data being clocked at the falling edge of CLK, as indicated by dashed lines 60. Thus, one clock is utilized in conjunction with rising edge flip-flops for generating external data signals, with the same clock signal being used in conjunction with falling edge flip-flops for generating external strobe signals.

Figure 7:
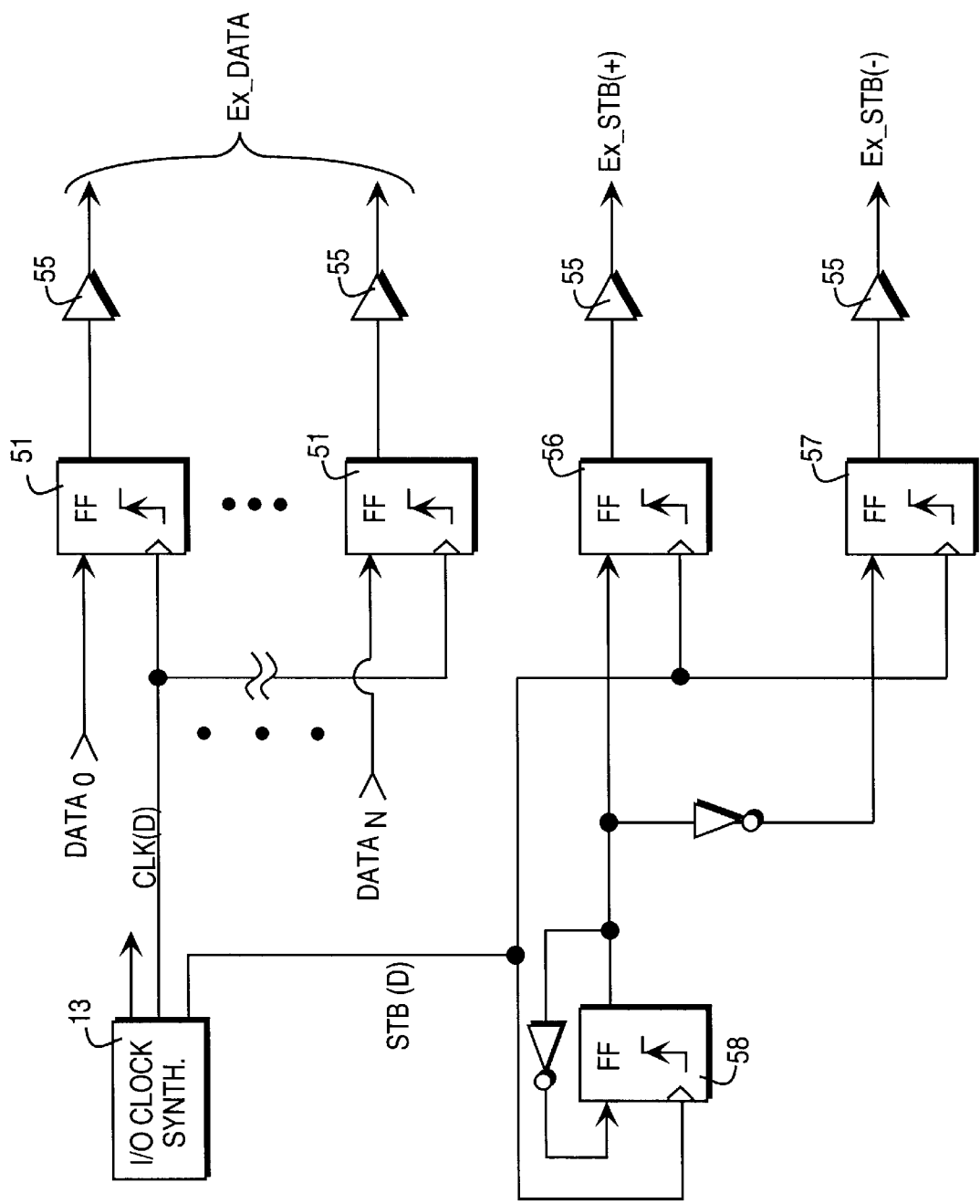
FIG. 7 is a logic diagram of an alternative circuit for producing external data and be signals from a synthesized clock signal.
Figure 8:
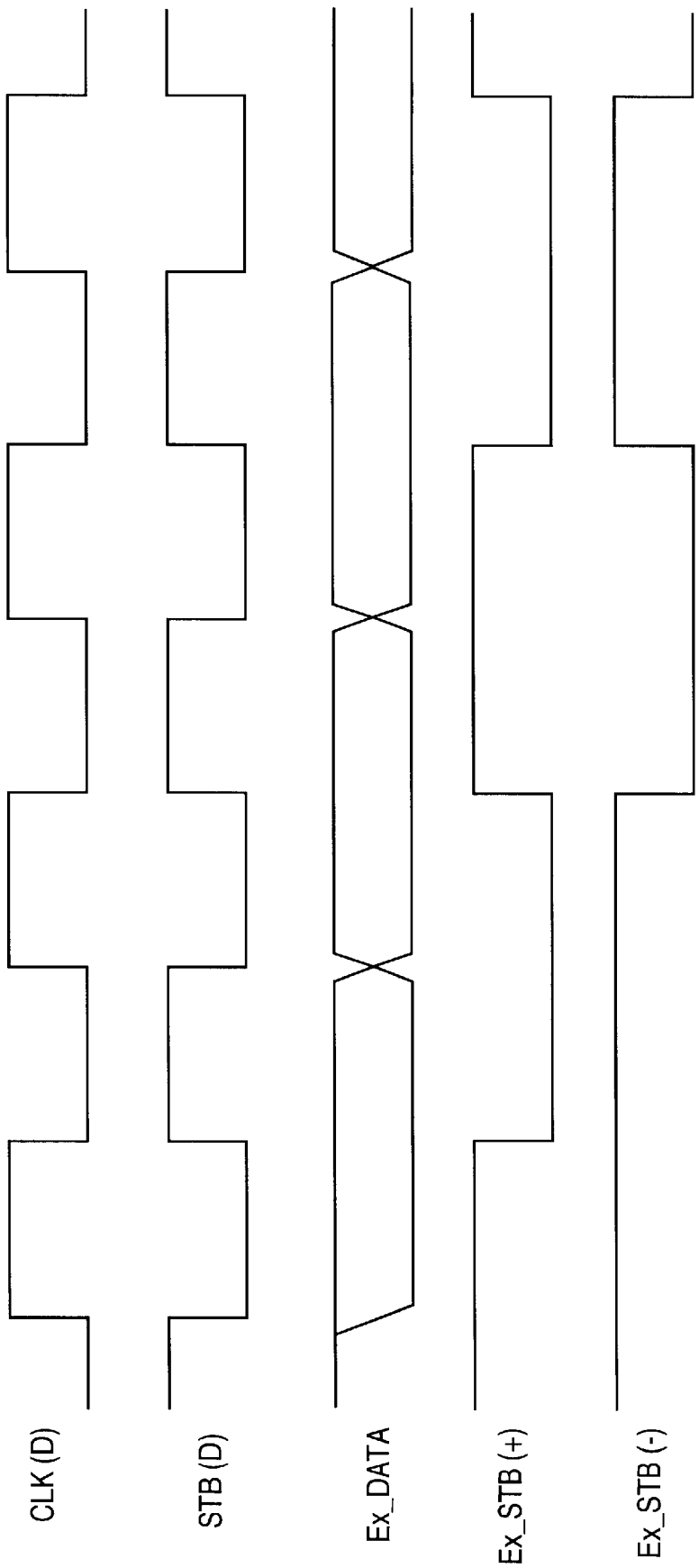
FIG. 8 illustrates the timing relationship of various signals shown in FIG. 7.

The same result can be achieved by using flip-flops that are all triggered on the rising edge as shown in the logic diagram of FIG. 7. The logic diagram of FIG. 7 is basically the same is that shown in FIG. 5, except that the rising edge flip-flops 56, 57 and 58, which are used to generate the external strobe signals EX_STB(+) and EX_STB(-), are clocked by the STB output generated by clock synthesizer 13. The timing diagram of FIG. 8 shows that the same outcome is achieved, e.g., centered strobing of the external data signals. Note that the strobe output STB of synthesizer 13 is simply the complement of the clock signal CLK produced by the same circuit.

Figure 9:
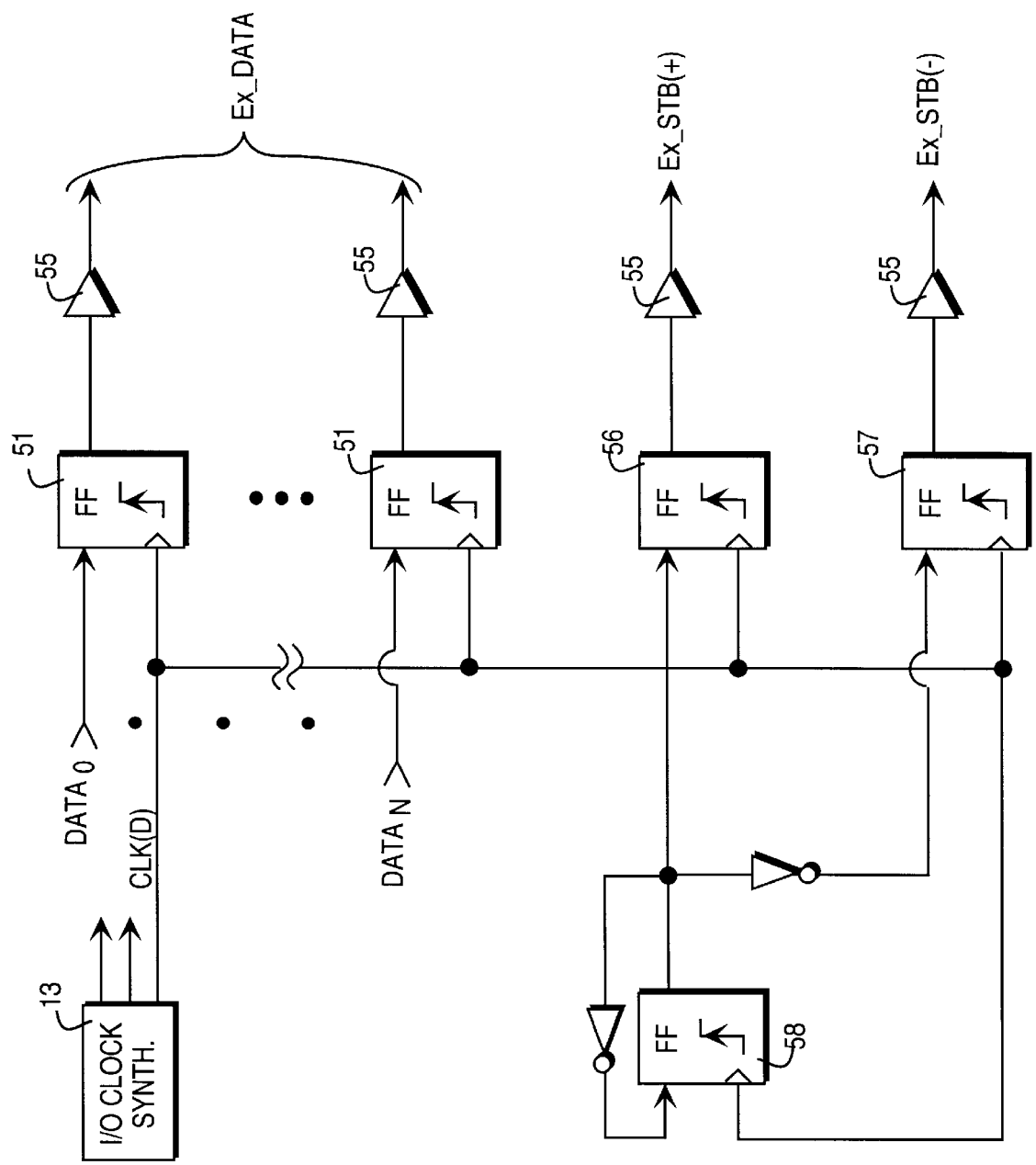
FIG. 9 is a logic diagram of still another alternative circuit for producing external data and strobe signals from a synthesized clock signal.

FIG. 9 shows yet another implementation of a logic circuit useful for generating external data and strobe signals. In FIG. 9, each of the flip-flops 51, 56, 57, and 58 comprise rising edge triggered flip-flops. As before, flip-flops 51 generate the external data signals driven onto the external bus via drivers 55. Flip-flop 56 generates the positive external strobe signal EX_STB(+), and flip-flop 57 generates being negative external strobe signal EX_STB(-). In this embodiment each of flip-flops are clocked by the clock signal CLK produced by synthesizer 13.

Figure 10:
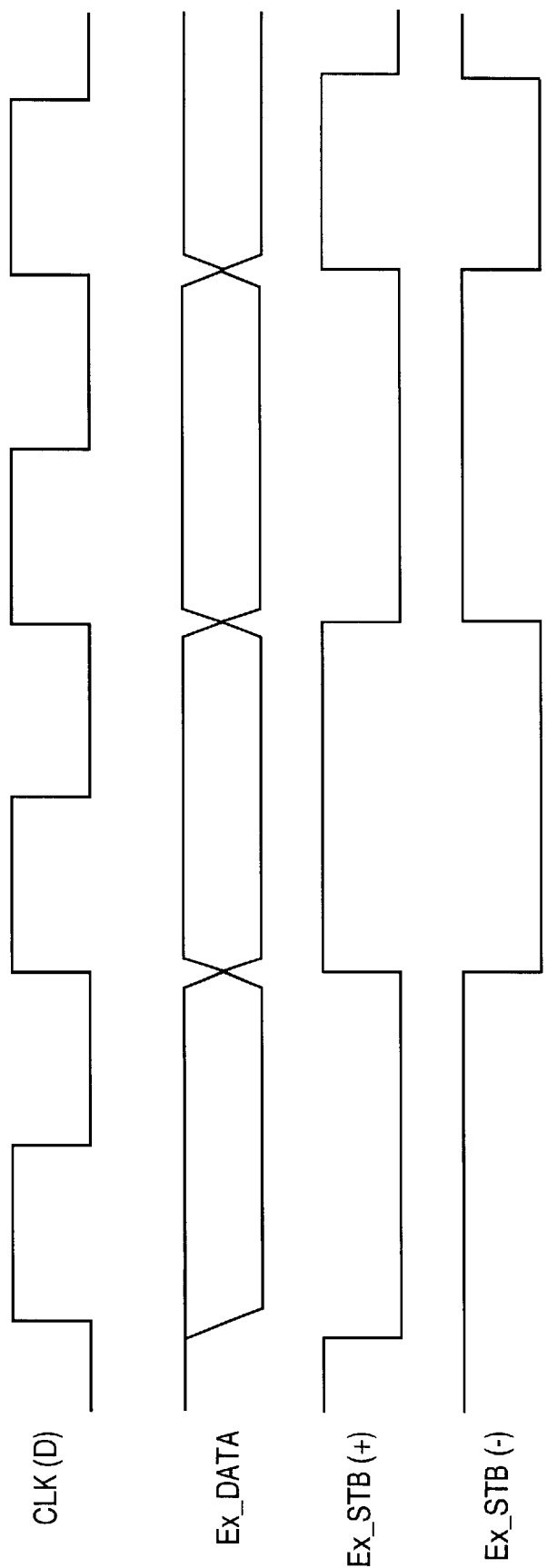
FIG. 10 illustrates the timing relationship of various signals shown in FIG. 9

FIG. 10 shows the timing relationship of the external data and strobe signals produced by the circuit of FIG. 9. From the timing diagram it is apparent that the implementation of FIG. 9 provides coincident strobing, rather than centered strobing with respect to the external data signals.

It should be understood that although the present invention has been described in conjunction with certain specific embodiments, numerous modifications and alterations could be made without departing from the scope of the present invention. For example, the invention has been described as producing a strobe clock signal that is centered with respect to the changing data signal. However, the complemented strobe signal (STB#) may also be utilized to provide a rising edge transition that is coincident with the changing data signal. In either case, the strobe signal is sent with every set of data with the strobe signal being distributed in the receiver to multiple locations. Accordingly, the specification and drawings are to be regarded in an illustrative, rather than a restrictive sense.

We claim:

1. A circuit for generating a clock signal that controls data operations in an integrated circuit (IC) comprising:

a first clock synthesizer that produces a first signal derived from an external reference signal, the first signal having a first frequency that is greater than a frequency of the external reference signal;

a divider circuit for dividing the frequency of the first signal by N, where N is an integer greater than 1, the divider circuit outputting a second signal having a second frequency which is equal to the first frequency divided by N;

a second clock synthesizer coupled to the divider circuit for producing the clock signal at a frequency which is an integer multiple of the second signal, the second clock synthesizer also to produce a strobe signal having a rising edge that is either centered, or is coincident, with respect to a changing data signal of a processor.

2. The circuit of claim 1 wherein the divider circuit is programmable.

3. The circuit of claim 1 wherein the first clock synthesizer comprises a phase-locked loop (PLL) circuit.

4. The circuit of claim 1 wherein the first clock synthesizer is operable in a first bypass mode of operation to produce the first signal from a second external reference signal.

5. The circuit of claim 1 wherein the second clock synthesizer comprises either a delay-locked loop or a phase-locked loop.

6. The circuit of claim 1 wherein the second clock synthesizer also produces a third signal, and the second clock synthesizer changes the data signal in response to the third signal.

7. The circuit of claim 1 wherein the integer multiple is 2.

8. The circuit of claim 1 wherein the integer multiple is 4.

9. The circuit of claim 6 wherein the second clock synthesizer includes a second bypass mode of operation that produces the third signal from an external clock signal.

10. The circuit of claim 1 wherein N is equal to 9.

11. The circuit of claim 1 wherein the clock signal has a 50% duty cycle.

12. A circuit for generating clock signals to control data operations in a processor comprising:

a first clock generator circuit that produces a first signal derived from an external reference signal, the first signal having a first frequency that is N times greater, where N is an integer greater than 1, than a frequency of the external reference signal;

a second clock generator circuit that produces a second clock signal derived from the external reference signal, the second clock signal having a second frequency that is M times greater, where M is an integer less than N, than the frequency of the external reference signal, the second clock generator circuit also producing a strobe signal at the frequency of the second clock signal the strobe signal having a fixed relationship to a data signal of a processor.

13. The circuit of claim 12 wherein the second clock generator circuit is operable in a bypass mode of operation to produce the second signal from an external clock signal.

14. The circuit of claim 12 wherein N and M are programmable in the first and second clock generator circuits, respectively.

15. The circuit of claim 12 wherein N is equal to 9 and M is equal to 4.

16. The circuit of claim 12 wherein the second clock generator circuit comprises either a delay-locked loop or a phase-locked loop.

17. The circuit of claim 12 wherein the first clock generator circuit comprises a phase-locked loop (PLL) circuit.

18. The circuit of claim 12 wherein the strobe signal has a 50% duty cycle.

19. A method of generating a set of clock signals to control data operations in an integrated circuit (IC) comprising the steps of:

generating a global signal for a processor from an external reference signal, the global signal having a first frequency that is greater than a frequency of the external reference signal;

dividing the frequency of the global signal by N, where N is an integer greater than 1, to produce a second signal having a second frequency which is equal to the first frequency divided by N; and generating a clock signal from the second signal at a frequency which is an integer multiple of the second signal, the clock signal having a rising edge that is either centered, or is coincident, with respect to a data signal of the IC.

20. The method of claim 19 further comprising the step of generating a third signal from the second signal, the data signal changing in response to the third signal.

21. The circuit of claim 19 wherein the integer multiple is 2.

22. The circuit of claim 19 wherein the integer multiple is 4.

23. The circuit of claim 19 wherein the clock signal has a 50% duty cycle.

* * * * *

UNITED STATES PATENT AND TRADEMARK OFFICE
CERTIFICATE OF CORRECTION

PATENT NO. : 6,477,657 B1  
DATED : November 5, 2002  
INVENTOR(S) : Karnik et al.

It is certified that error appears in the above-identified patent and that said Letters Patent is hereby corrected as shown below:

Column 2,
Line 55, delete "be", insert -- strobe --.

Signed and Sealed this

Twenty-fifth Day of March, 2003

JAMES E. ROGAN
*Director of the United States Patent and Trademark Office*